United States Patent [19]
Juang et al.

[11] Patent Number: 6,097,256
[45] Date of Patent: Aug. 1, 2000

[54] COMPLEMENTARY METAL-OXIDE SEMICONDUCTOR HIGH-FREQUENCY RING OSCILLATOR

[75] Inventors: Dar-Chang Juang; De-Sheng Chen, both of Hsinchu, Taiwan

[73] Assignee: Industrial Technology Research Institute, Chutung, Taiwan

[21] Appl. No.: 09/267,882

[22] Filed: Mar. 11, 1999

[30] Foreign Application Priority Data

Mar. 16, 1998 [TW] Taiwan ................................ 87103886

[51] Int. Cl.[7] .............................. H03B 5/02; H03K 3/354
[52] U.S. Cl. ......................... 331/57; 331/45; 331/177 R
[58] Field of Search ........................... 331/57, 45, 177 R

[56] References Cited

U.S. PATENT DOCUMENTS

| | | | |
|---|---|---|---|
| 5,426,398 | 6/1995 | Kuo | 331/57 |
| 5,963,101 | 10/1999 | Iravani | 331/57 |

*Primary Examiner*—Siegfried H. Grimm
*Attorney, Agent, or Firm*—J. C. Patents; Jiawei Huang

[57] ABSTRACT

A CMOS (complementary metal-oxide semiconductor) high-frequency ring oscillator is provided for generating an output frequency in response to a control voltage in a wide bandwidth. The ring oscillator is of the type including a plurality of cascaded delay circuits, such as CMOS CSL (common-sense logic) inverters. The ring oscillator is characterized by the additional incorporation of each of the CMOS CSL inverters with either a positive-feedback gate structure or a positive-feedback drain structure so as to improve the output-to-output characteristics of the ring oscillator. More specifically, the ring oscillator is still operable to output an oscillating signal even though the control voltage is reduced to below a certain level, at which point the gain is still larger than 1. The ring oscillator is therefore more advantageous than the prior art both in gain and output-to-output characteristics and is operable over a wide variety of output frequencies, particularly in the low-frequency regions.

9 Claims, 8 Drawing Sheets

US 6,097,256

COMPLEMENTARY METAL-OXIDE SEMICONDUCTOR HIGH-FREQUENCY RING OSCILLATOR

CROSS-REFERENCE TO RELATED APPLICATION

This application claims the priority benefit of Taiwan application serial no. 87103886, filed Mar. 16, 1998, the full disclosure of which is incorporated herein by reference.

BACKGROUND OF THE INVENTION

1. Field of the Invention

This invention relates to oscillators, and more particularly, to a high-frequency ring oscillator which is constructed from a ring of cascaded delay circuits each being implemented from a CMOS (complementary metal-oxide semiconductor) inverter incorporated with either a positive-feedback gate structure or a positive-feedback drain structure so as to improve the output-to-output characteristics of the ring oscillator.

2. Description of the Related Art

A ring oscillator is a circuit that includes a ring of cascaded delay circuits, such as a ring of cascaded inverters, for generating an oscillating signal at a frequency proportional to the magnitude of a control voltage. The overall feedback gain of the cascaded delay circuits should be greater than 1 and inverted in phase. Assume the total number of the cascaded delay circuits is n.

If n is very large or the operating frequency is very low, the ring oscillator will operate in a delayed oscillation mode. In this mode, the output frequency $f_{OSC}$ of the ring oscillator is as follows:

$$F_{OSC} = 1/[n \cdot (t_{pHL} + t_{pHL})]$$

where $(t_{pLH} + t_{pHL})$ is the delay time in each of the cascaded delay circuits.

On the other hand, if n is small and the operating frequency is high, the ring oscillator will operate in a phase-shifting sinusoidal oscillation mode. In this mode, the output angular frequency $\omega_{OSC}$ (where $\omega_{OCS} = 2\pi f_{OSC}$) of the ring oscillator will comply with the following Nyquist criteria:

$$|\beta A(\omega_{OSC})| = 1$$

$$\theta(\omega_{OSC}) = 180°$$

where $\beta$ is the feedback factor;

$\beta A$ is loop gain; and $\theta$ is phase shift.

Since $\beta = 1$, the ring oscillator should be designed in such a manner that $A \geq 1$ and $\theta = 180°/n$. The provision of $A \geq 1$ ensures that the ring oscillator can output an oscillating signal. However, if A>1, it will cause the remaining oscillating signal to continuously increase in amplitude until reaching the top and bottom nonlinear regions. In these regions, both the gain and the bandwidth will decrease, causing the oscillating signal to be somewhat distorted in waveform. However, in these regions, the operating mode of the ring oscillator will be close to the delayed oscillation mode, causing the output frequency of the oscillating signal to be decreased slightly. Therefore, the gain should not be designed to be overly large.

The delay circuits used in the ring oscillator are best implemented from common source logic (CSL) circuits, such as CSL inverters. A CSL circuit is a differential-type of amplifier. As mentioned above, the CSL circuit should not be overly large in gain near the low-frequency region in order to allow the ring oscillator to generate the highest possible frequency.

In high-frequency ring oscillators of more than 1 GHz, since they typically include a lesser number of delay circuits, the output frequency is sinusoidal in waveform rather than a full-swing square waveform. In the case of a 4-stage ring oscillator, for example, the delay circuits are each operated in such a manner that the absolute value of the gain is greater than 1 i.e., |A|>1) for each phase shift of 45°. However, when operating under a low working voltage, since the common current source cannot be kept in the saturation mode all the time, the common-mode gain will become the primary factor that affects the output frequency. Therefore, under this condition, the output frequency of the voltage controlled oscillator (VCO) is not be adjusted in a linear manner with the magnitude of the control current.

FIG. 1 is a schematic block diagram of a conventional 4-stage ring oscillator. As shown, this conventional ring oscillator includes four cascaded stages of CSL inverters 10, 20, 30, 40, a first CSL buffer 50, a second CSL buffer 60, and a CSL divide-by-2 divider 70. The four CSL inverters 10, 20, 30, 40 are all identical in function and structure as illustrated in FIG. 2.

The CSL inverter of FIG. 2 is symmetrical in CMOS configuration, including PMOS transistors P1, P2, and NMOS transistors N1, N2, N3. Further, the CMOS CSL inverter has a positive input port 310, a negative input port 320, a positive outlet port 330, and a negative outlet port 340. A control voltage $V_{ctl}$ is applied to the gate of the NMOS transistor N3. Assume body effect is neglected, then the gain Av and 45-degree phase-shift frequency $f_{-3dB}$ of the CMOS CSL inverter of FIG. 2 can be formulated as follows:

$$Av = \frac{V_{od}}{V_{id}} = \frac{-2 \cdot g_{mN1} \cdot r_{dN1} \cdot r_{P1}}{(g_{mN1} \cdot r_{dN1} + 1) \cdot \left(\frac{1}{g_{mN1}} + \frac{1}{g_{mN2}} // r_{N3}\right)}$$

$$g_{mN1} = g_{mN2} = (V_{GSN1} - V_{tN1}) \cdot \mu_N \cdot CoxW/L = (2 \cdot I_{DN1} \cdot \mu_N \cdot Cox \cdot W/L)^{1/2}$$

$$r_{N3} = 1/[(V_{GSN3} - V_{tN3} - V_{DSN3}) \cdot \mu_N \cdot Cox \cdot W/L]$$

$$r_{P1} = 1/[(V_{GSP1} - V_{tP1} - V_{DSP1}) \cdot \mu_P \cdot Cox \cdot W/L]$$

$$r_{dN1} = 1/(\lambda \cdot I_{DN1})$$

$$f_{-3dB} = 1/(2\pi \cdot t_P)$$

$$t_P = (r_{p1} // r_{dN1}) \cdot C_L$$

$$C_L = C_{dbP1} + 0.5 \cdot Cox_{P1} \cdot W_{P1} \cdot L_{P1} + C_{dbN1} \cdot (1 - Av) \cdot C_{gdN1} + C_{stray}$$

where $V_{od}$ is output differential voltage;

$V_{id}$ is input differential voltage;

$g_{m\ N1}$ is the transconductance of the NMOS transistor N1;

$g_{m\ N2}$ is the transconductance of the NMOS transistor N2;

$V_{GS\ N1}$ is bias to the NMOS transistor N1;

$V_{tN1}$ is the threshold voltage of the NMOS transistor N1;

$\mu_N$ is the carrier mobility of the NMOS transistor;

Cox is the unit gate capacitance of the NMOS transistor;

$\lambda$ is the channel modulation constant; and $t_p$ is the main extreme time constant.

Assume the 0.5μ5.0V2p3m CSL inverter manufactured by the TSMC (Taiwan Semiconductor Manufacture Corporation) of Taiwan is used to serve as each of the CSL inverters in the ring oscillator of FIG. 1. Assume the common-mode voltage $V_{CM}$ at the differential input of the CSL inverter is $V_{CM}$=1.2 V (which serves as a DC bias to the CSL inverter). Then, with the first and second CSL buffers 50, 60 and the CSL divide-by-2 divider 80 serving as a load to the cascaded CSL inverters 10, 20, 30, 40, the simulated results of the gain and 45-degree phase-shift frequency $f_{-3dB}$ are shown in the following Table 1.

TABLE 1

| $V_{ctl}$ (volt) | 1.5 | 1.4 | 1.3 | 1.2 | 1.1 | 1.0 | 0.9 |
|---|---|---|---|---|---|---|---|
| Av (times) | 1.20 | 1.16 | 1.1 | 1.014 | 0.884 | — | — |
| $f_{-3dB}$ (GHz) | 1.35 | 1.36 | 1.37 | 1.39 | 1.40 | — | — |
| $I_{DS\ N3}$ (μA) | 235 | 219 | 198 | 172 | 135 | — | — |

From the data shown in Table 1, it can be learned that the prior art of FIGS. 1–2 has the following drawbacks.

(1) First, it can be seen that the drain-to-source current $I_{DS\ N3}$ of the NMOS transistor N3 decreases as the control voltage $V_{ctl}$ at the gate of the NMOS transistor N3 is decreased. However, the 45-degree phase-shift frequency $f_{-3dB}$ increases with the current $I_{DS\ N3}$. This is because that as the current $I_{DS\ N3}$ decreases, it causes the channel capacitance of the PMOS transistor working in the linear region to be reduced. Moreover the rate of change of the channel capacitance is faster than that of the transconductance.

(2) Second, as the current $I_{DS\ N3}$ decreases, it causes the gain to decrease as well, thus decreasing the amplitude of the output frequency of the ring oscillator. Therefore, the ring oscillator is unable to operate when the control voltage falls below a certain level to generate a low frequency output.

(3) Third, when the control voltage $V_{ctl}$ is below 1.2 V, the gain is reduced to below 1, which does meet application requirements.

Due to the foregoing drawbacks, the conventional ring oscillator is inoperable when the control voltage is reduced to lower than 1.2 V, at which point the gain is reduced to below 1.

SUMMARY OF THE INVENTION

It is therefore an objective of the present invention to provide a ring oscillator which is designed based on a regeneration logic scheme to allow the ring oscillator to be still operable when the control voltage is reduced to below a certain level.

In accordance with the foregoing and other objectives of the present invention, an improved ring oscillator is provided. The ring oscillator of the invention is characterized in that each of the CMOS CSL inverters therein is additionally incorporated with either a positive-feedback gate structure or a positive-feedback drain structure so as to improve the output-to-input characteristics of the ring oscillator. More specifically, the ring oscillator of the invention is still operable and outputs an oscillating signal even though the control voltage falls below a certain level, and at which point the gain is still larger than 1. The invention therefore has the advantage over the prior art both in gain and output-to-input characteristics and is operable over a wide bandwidth of output frequency.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 2:
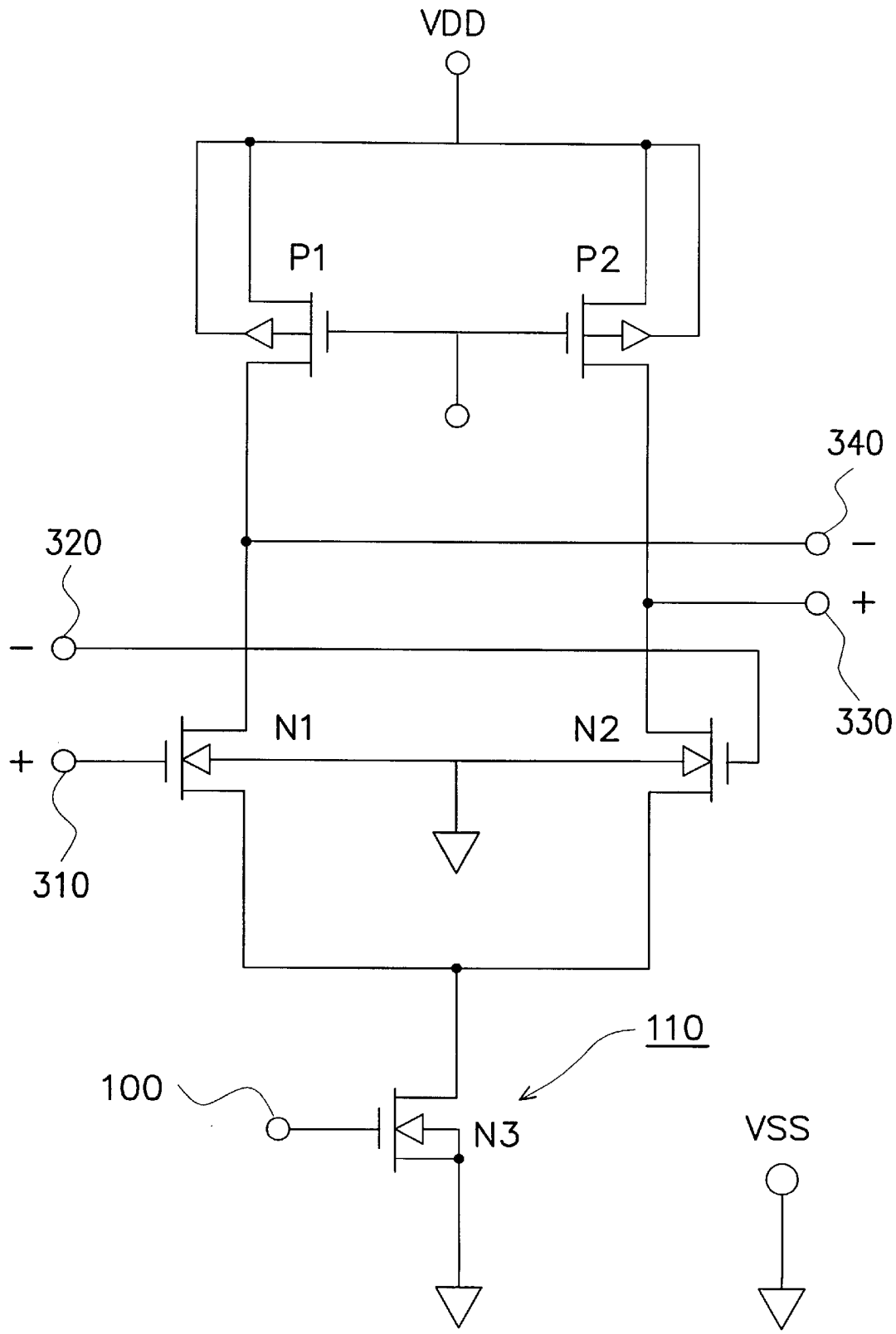
FIG. 2 is a schematic circuit diagram of a conventional CMOS CSL inverter which is utilized to serve as each of the delay circuits in the conventional 4-stage ring oscillator of FIG. 1.
Figure 3:
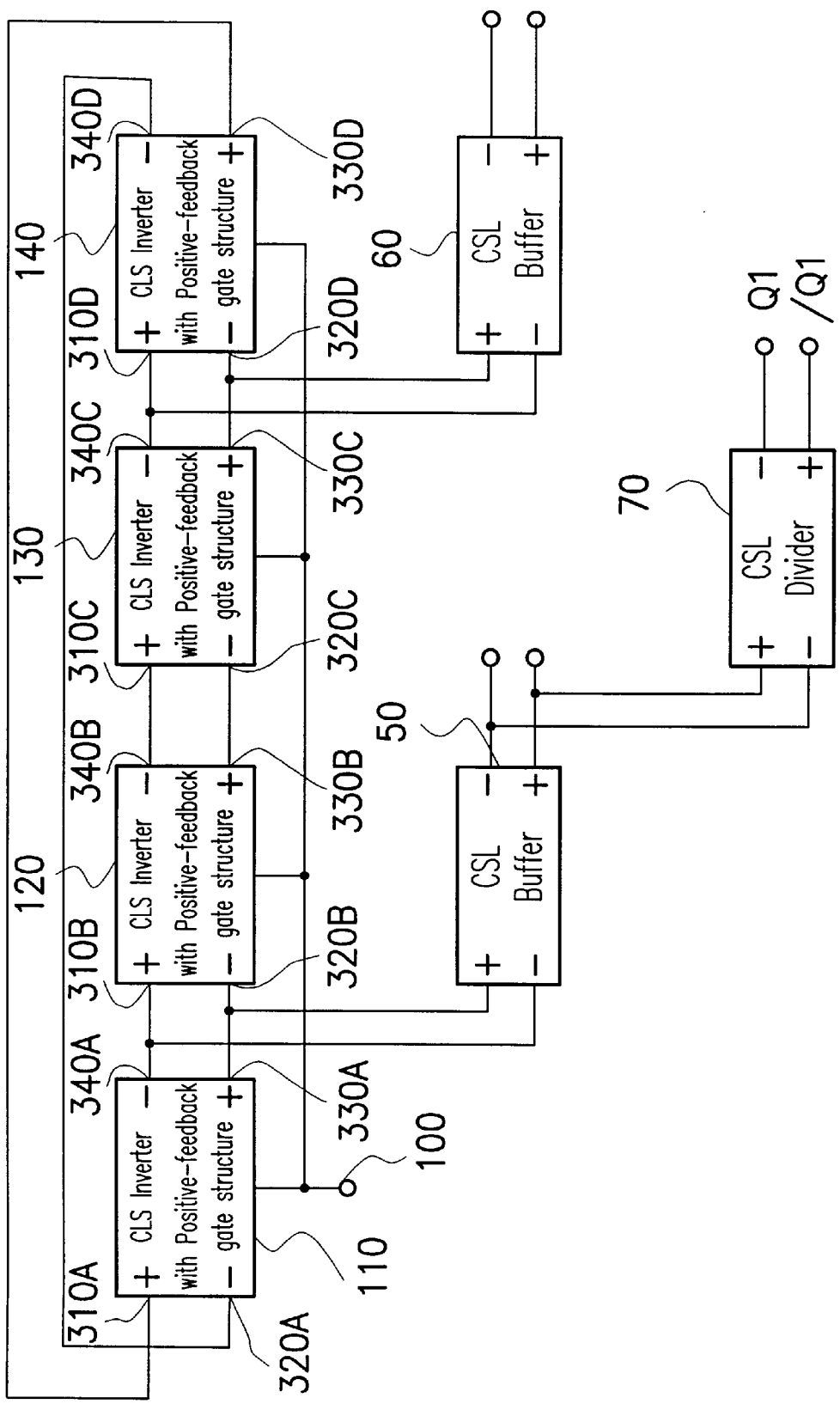
FIG. 3 is a schematic block diagram of a first preferred embodiment of the high-frequency ring oscillator of the invention.
Figure 4:
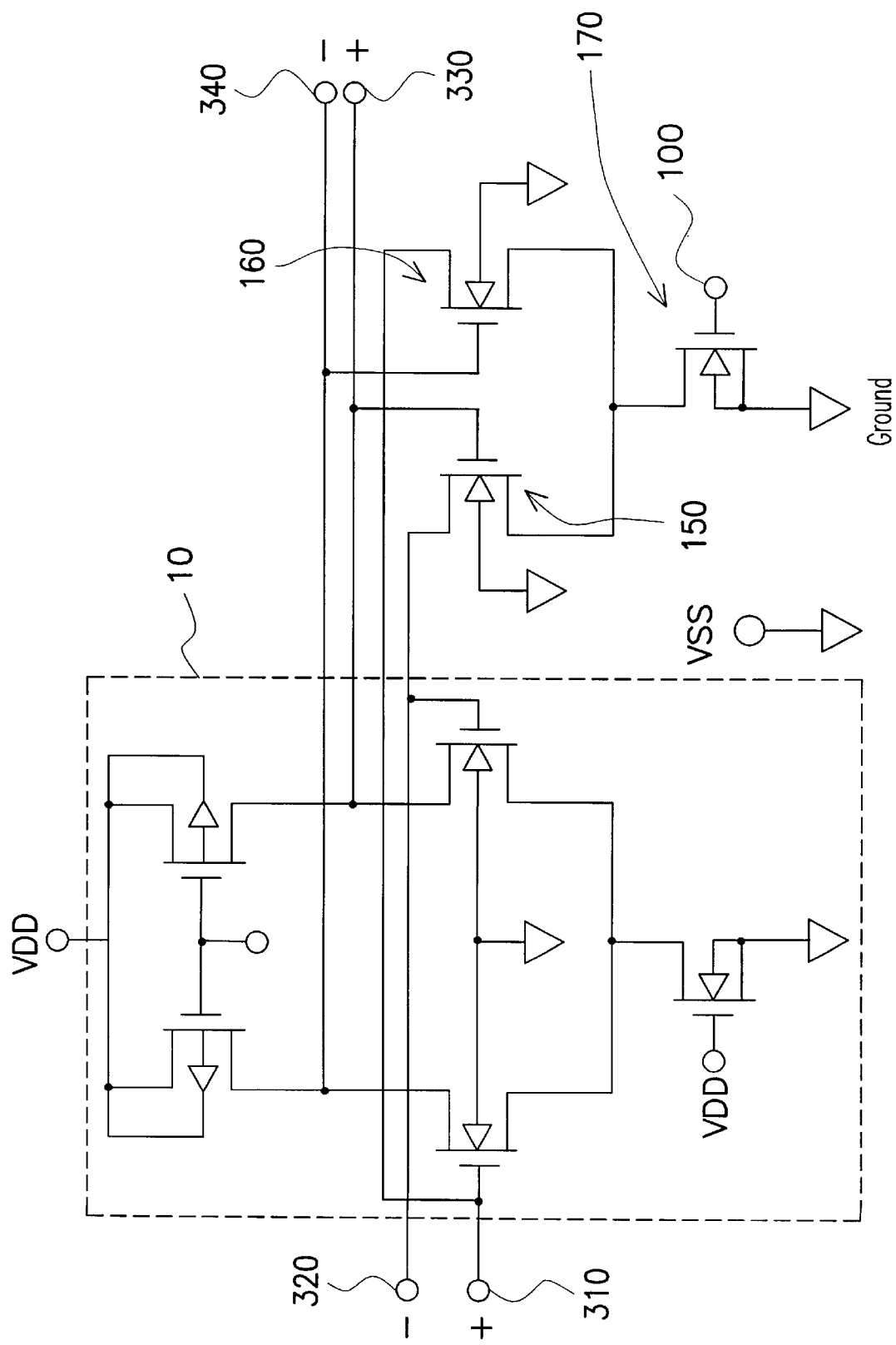
FIG. 4 is a schematic circuit diagram of an improved delay circuit (a CMOS CSL inverter incorporated with a positive-feedback gate structure) which is utilized in the ring oscillator of FIG. 3.

FIG. 3 is a schematic block diagram showing the architecture of a first preferred embodiment of the high-frequency ring oscillator according to the invention. In the example of FIG. 3, a 4-stage ring oscillator is shown, but it is to be understood that the number of stages can vary. As shown in FIG. 4, the ring oscillator of this embodiment includes a ring of four improved delay circuits 110, 120, 130, 140, a first CSL bugger 50, a second CSL buffer 60, and a CSL divide-by-2 divider 70. The architecture of the ring oscillator of the invention shown here is substantially identical to the prior art of FIG. 1 except that the improved delay circuits 110, 120, 130, 140 are here constructed in a different manner as shown in FIG. 4. More specifically, the four delay circuits 110, 120, 130, 140 each include an additional positive-feedback gate structure to the CMOS CSL inverter of FIG. 2.

In the delay circuit of FIG. 4, the circuit part that is enclosed in a dashed box indicated by the reference numeral 10 is structurally identical to the conventional CMOS CSL inverter of FIG. 2. In a similar manner, the CMOS CSL inverter 10 includes a positive input port 210, a negative input port 320, a positive output port 330, and a negative output port 340. In addition to the CMOS CSL invert or 10, the improved delay circuit includes a first CMOS transistor 150, a second CMOS transistor 160, and a third CMOS transistor 170 which in combination constitute a positive-feedback gate structure for the CMOS CSL inverter 10.

The first CMOS transistor 150 is connected in such a manner that its drain is connected to the negative input port 320 of the CMOS CSL inverter 10; its source is connected to the drain of the third CMOS transistor 170; and its gate is connected to the positive output port 330 of the CMOS CSL inverter 10.

The second CMOS transistor 160 is connected in such a manner that its drain is connected to the positive input port 310 of the CMOS CSL inverter 10; its source is connected to the drain of the third CMOS transistor 170; and its gate is connected to the negative output port 340 of the CMOS CSL inverter 10.

The third CMOS transistor 170 is connected in such a manner that its drain is connected to both the source of the first CMOS transistor 150 and the source of the second CMOS transistor 160; its source is connected to the ground; and its gate is connected to a control voltage 100.

referring back to FIG. 3, the whole circuit of FIG. 4 is utilized to serve as each of the four delay circuits 110, 120, 130, 140 in the 4-stage ring oscillator of this embodiment. The positive input port 310, the negative input port 320, the positive output port 330, and the negative output port 340 of the circuit of FIG. 3 are here instead designated by 310A, 320A, 330A, and 340A for the first delay circuit 110; by 310B, 320B, 330B, and 340B for the second delay circuit 120; by 310C, 320C, 330C, and 340C for the third delay circuit 130; and by 310D, 320D, 330D, and 340D for the fourth delay circuit 140. These four delay circuits 110, 120, 130, 140 are interconnected as follows.

The first delay circuit 110 is connected in such a manner that its positive input port 310A is connected to the positive output port 330D of the fourth delay circuit 140; its negative input port 320A is connected to the negative output port 340D of the fourth delay circuit 140; its positive output port 330A is connected to the negative input port negative input port 320B of the second delay circuit 120; and its negative output port 340A is connected to the positive input port 310B of the second delay circuit 120.

The second delay circuit 120 is connected in such a manner that its positive input port 310B is connected to the negative output port 340A of the first delay circuit 110; its negative input port 320B is connected to the positive output port 330A of the first delay circuit 110; its positive output port 330B is connected to the negative input port 320C of the third delay circuit 130; and its negative output port 340B is connected to the positive input port 310C of the third delay circuit 130.

the third delay circuit 130 is connected in such a manner that its positive input port 310C is connected to the negative output port 340B of the second delay circuit 120; its negative input port 320C is connected to the positive output port 330B of the second delay circuit 120; its positive output port 330C is connected to the negative input port 320D of the fourth delay circuit 140; and its negative output port 340C is connected to the positive input port 310D of the fourth delay circuit 140.

The fourth delay circuit 140 is connected in such a manner that its positive input port 310D is connected to the negative output port 340C of the third delay circuit 130; its negative input port 320D is connected to the positive output port 330C of the third delay circuit 130; its positive output port 330D is connected to the positive input port 310A of the first delay circuit 110 (a positive feedback connection); and its negative output port 340D is connected to the negative input port 320A of the first delay circuit 110 (a negative feedback connection).

Moreover, these four delay circuits 110, 120, 130, 140 are all connected to a common control voltage 100. The first CSL buffer 50 is coupled to the output ports 330A, 340A of the first delay circuit 110, while the second CSL buffer 60 is coupled to the output ports 330C, 340C of the third delay circuit 130. The CSL divide-by-2 divider 70 is coupled to the output ports of the first CSL buffer 50. The first CSL buffer 50 can also check whether the CSL divide-by-2 divider 70 operates normally.

The improvements on the characteristics of the ring oscillator of FIG. 3 over the prior art of FIG. 1 will be described later in this specification.

Second Preferred Embodiment

Figure 5:
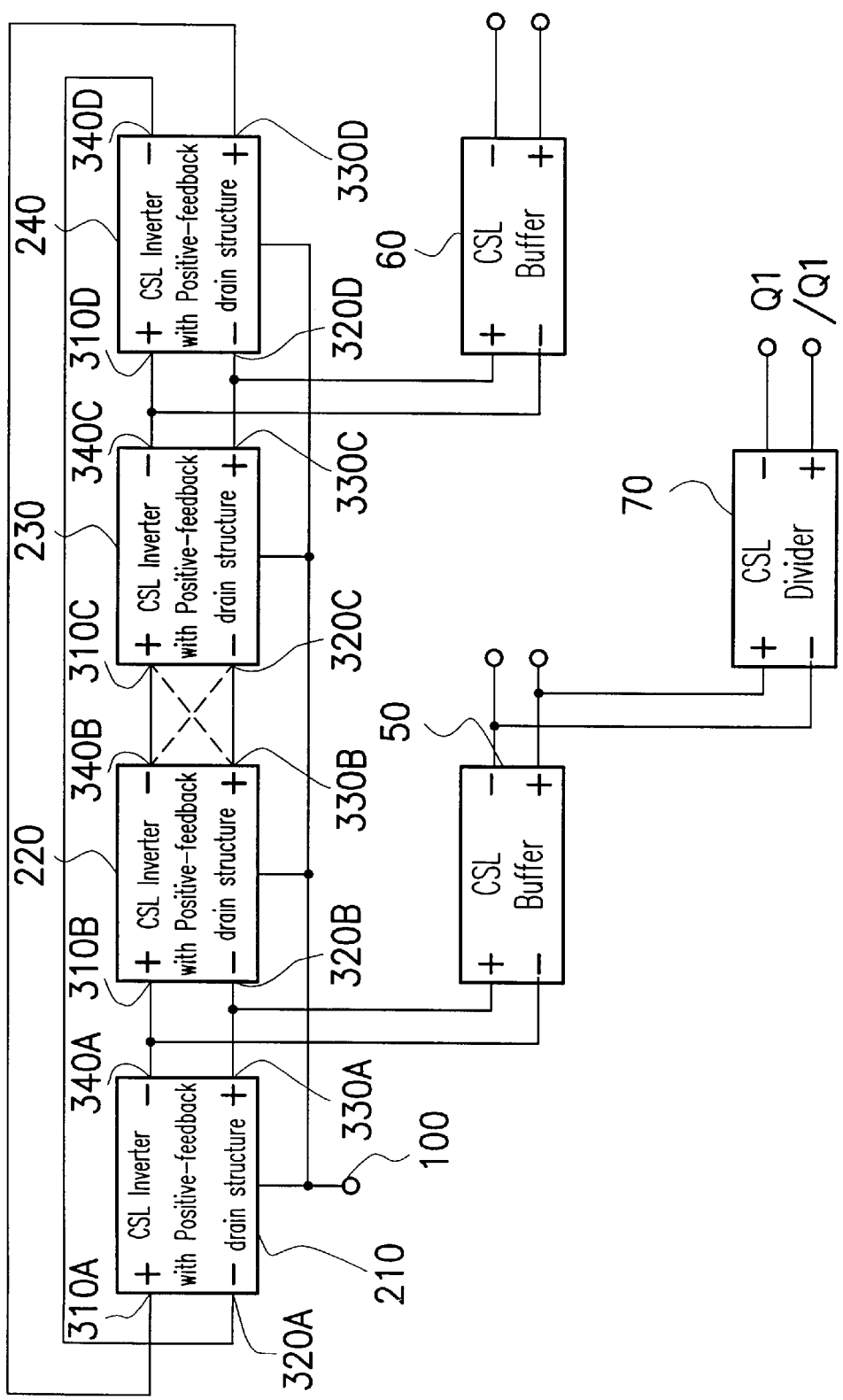
FIG. 5 is a schematic block diagram of a second preferred embodiment of the high-frequency ring oscillator of the invention.
Figure 6:
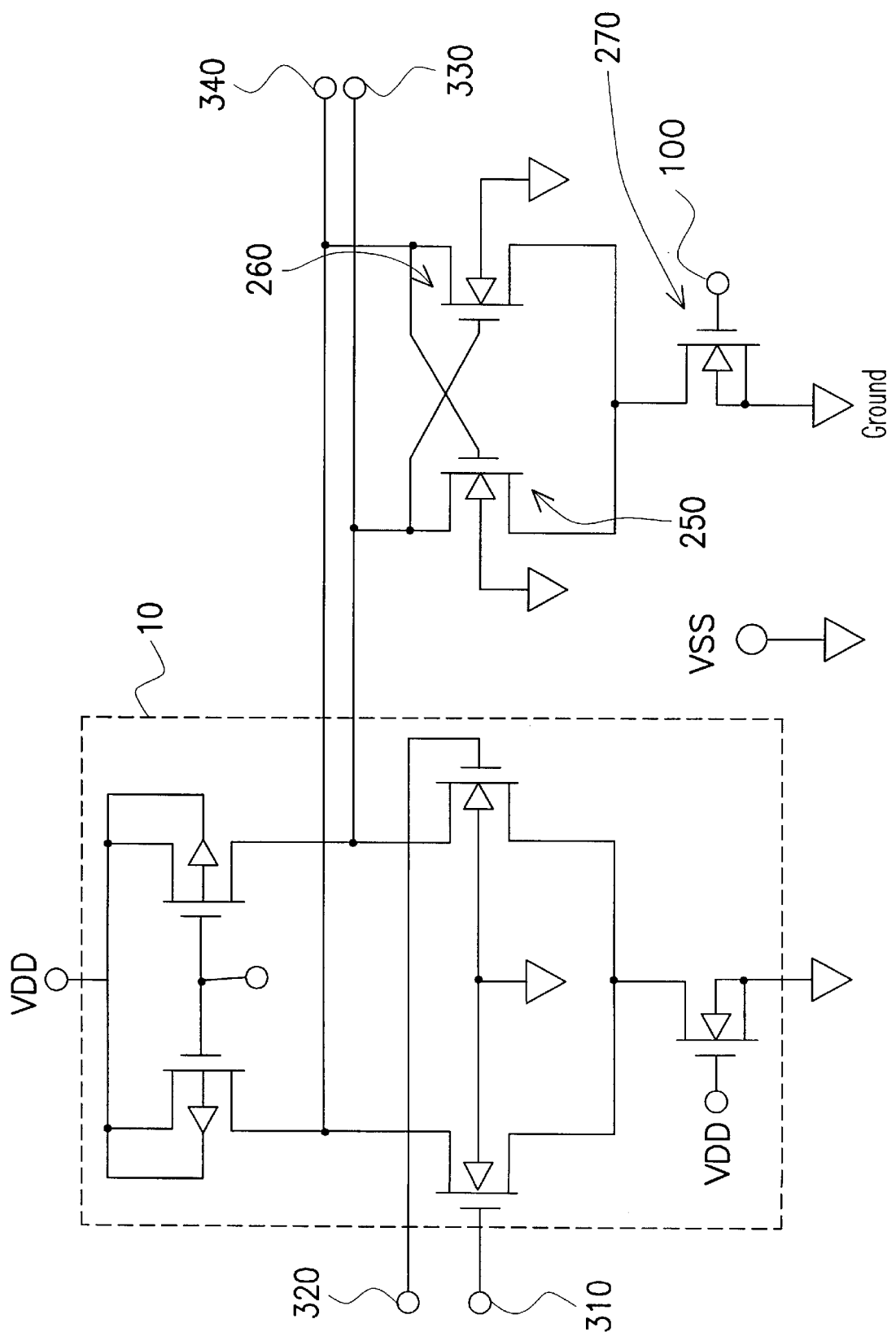
FIG. 6 is a schematic circuit diagram of another improved delay circuit (a CMOS CSL inverter incorporated with a positive-feedback drain structure) which is utilized in the ring oscillator of FIG. 5.

FIG. 5 is a schematic block diagram showing the architecture of a second preferred embodiment of the high-frequency ring oscillator according to the invention. In the example of FIG. 5, the number of stages in the ring oscillator is an even number (i.e., 4), but it is to be understood that it also can be an odd number such as 3, 5, or 7. As shown, the ring oscillator of this embodiment includes a ring of four improved delay circuits 210, 220, 230, 240, a first CSL buffer 50, a second CSL buffer 60, and a CSL divide-by-2 divider 70. The ring oscillator of this embodiment is substantially identical in architecture to the prior art of FIG. 1 except that the four delay circuits 210, 220, 230, 240 are here constructed in a different manner, as illustrated in FIG. 6. More specifically, the four delay circuits 210, 220, 230, 240 each include an additional positive-feedback drain structure to the CMOS CSL inverter of FIG. 2.

In the delay circuit of FIG. 6, the circuit part that is enclosed in a dashed box indicated by the reference numeral 10 is identical in structure to the conventional CMOS CSL inverter of FIG. 2. In a similar manner, the CMOS CSL inverter 10 includes a positive input port 310, a negative input port 320, a positive output port 330, and a negative output port 340. In addition to the CMOS CSL inverter 10, the improved delay circuit of FIG. 6 includes a first CMOS transistor 250, a second CMOS transistor 260, and a third CMOS transistor 270, which in combination constitute a positive-feedback drain structure for the CMOS CSL inverter 10.

The first CMOS transistor 250 is connected in such a manner that its drain is connected to both the positive output port 330 of the CMOS CSL inverter 10 and the gate of the second CMOS transistor 260; its source is connected to the drain of the third CMOS transistor 270; and its gate is connected to the negative output port 340 of the CMOS CSL inverter 10.

The second CMOS transistor 260 is connected in such a manner that its drain is connected to both the negative output port 340 of the CMOS CSL inverter 10 and the gate of the first CMOS transistor 250; its source is connected to the drain of the third CMOS transistor 270; and its gate is connected to the positive output port 330 of the CMOS CSL inverter 10.

The third CMOS transistor 270 is connected in such a manner that its drain is connected to both the source of the first CMOS transistor 250 and the source of the second CMOS transistor 260; its source is connected to the ground; and its gate is connected to a control voltage 100.

Referring back to FIG. 5, the whole circuit of FIG. 6 is utilized to serve as each of the delay circuits 210, 220, 230, 240 in the ring oscillator of this embodiment. The positive input port 310, the negative input port 320, the positive output port 330, and the negative output port 340 of the circuit of FIG. 6 are here designated by 310A, 320A, 330A, and 340A for the first delay circuit 210; by 310B, 320B, 330B, and 340B for the second delay circuit 220; by 310C, 320C, 330C, and 340C for the third delay circuit 230; and by 310D, 320D, 330D, and 340D for the fourth delay circuit 240.

In the case of the total number of stages in the ring oscillator of FIG. 5 being an even number, for example 4, the four delay circuits 210, 220, 230, 240 are interconnected in the same manner as the previous embodiment. Therefore, detailed description thereof will not be repeated here.

In the case of the total number of stages being an odd number, for example 3, 5, or 7, each adjoining pair of the delay circuits are interconnected in such a manner that the positive output port of the first stage is connected to the negative input port of the next stage, and the twisted connection in the case of even-number of stages is unnecessary. In the case of FIG. 5, for example, the positive output port of the fourth delay circuit 240 is connected to the positive input port of the first delay circuit 210, while the negative output port of the fourth delay circuit 240 is connected to the negative input port of the first delay circuit 210. Therefore, the invention is applicable to ring oscillators with either and even-number stages of delay circuits or an odd-number stages of delay circuits.

Furthermore, all of the delay circuits 210, 220, 230, 240 are connected to a common control voltage 100. The first CSL buffer 50 is coupled to the output ports 330A, 340A of the first delay circuit 210, while the second CSL buffer 60 is coupled to the output ports 330C, 340C of the third delay circuit 230. The CSL divide-by-2 divider 70 is coupled to the output ports of the first CSL buffer 50. The first CSL buffer 50 can also check whether the CSL divide-by-2 divider 70 operates normally.

Comparison

Figure 1:
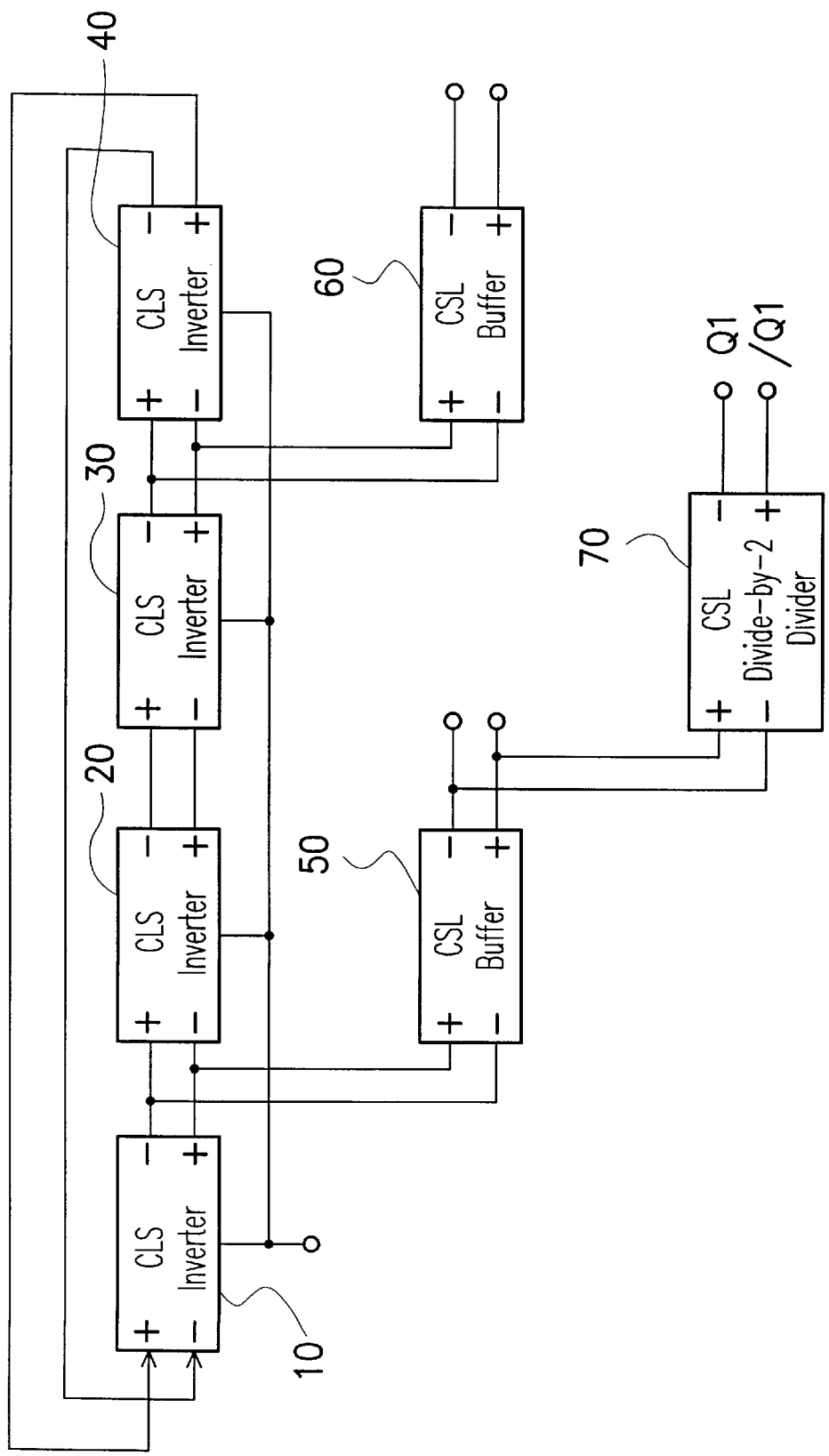
FIG. 1 is a schematic block diagram of a conventional 4-stage ring oscillator.

In a simulation test, the first preferred embodiment of FIG. 3 and the second preferred embodiment of FIG. 5 according to the invention are compared with the prior art of FIG. 1 by the TSMC's 0.5μ5.0V2p3m process. The output frequency, the amplitude of the outer frequency, and the output current are measured in response to various magnitudes of the control voltage. The resulting data are shown in Table 2.

TABLE 2

| Vctl (Vdc) | 1.5 | 1.4 | 1.3 | 1.2 | 1.1 | 1.0 | 0.9 | 0.8 | 0.7 | 0.6 |
|---|---|---|---|---|---|---|---|---|---|---|
| $f_g$ (GHz) | 0.681 | 0.701 | 0.733 | 0.775 | 0.857 | 0.970 | 1.09 | 1.19 | 1.24 | 1.25 |
| $f_d$ (GHz) | 0.876 | 0.889 | 0.912 | 0.932 | 0.985 | 1.062 | 1.143 | 1.207 | 1.225 | 1.231 |
| $f_c$ (GHz) | 1.23 | 1.24 | 1.25 | 1.25 | — | — | — | — | — | — |
| $V_{og}$ (mVpp) | 599 | 592 | 577 | 563 | 531 | 474 | 395 | 325 | 289 | 281 |
| $V_{od}$ (mVpp) | 698 | 691 | 674 | 645 | 597 | 519 | 424 | 337 | 294 | 281 |
| $V_{oc}$ (mVpp) | 530 | 478 | 406 | 270 | — | — | — | — | — | — |
| $I_g$ (mA) | 2.58 | 2.57 | 2.56 | 2.54 | 2.50 | 2.44 | 2.34 | 2.35 | 2.34 | 2.33 |
| $I_d$ (mA) | 2.62 | 2.61 | 2.59 | 2.56 | 2.52 | 2.44 | 2.38 | 2.35 | 2.34 | 2.33 |
| $I_c$ (mA) | 2.28 | 2.22 | 2.13 | 1.96 | — | — | — | — | — | — |

Figure 8:
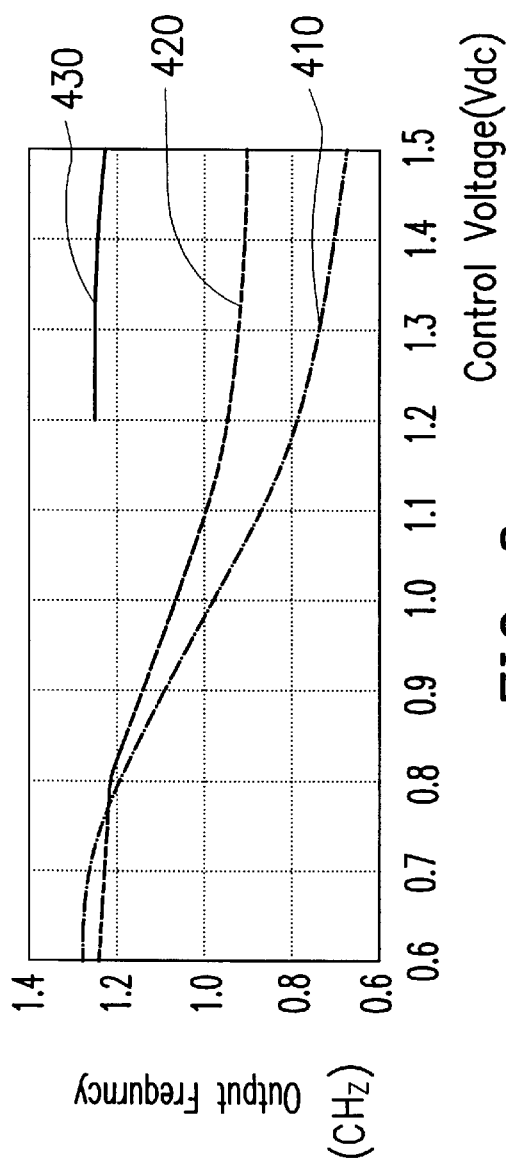
FIG. 8 is graph showing the plots of the output-to-input characteristics (i.e., output frequency versus control voltage) for the invention and the prior art.
Figure 9:
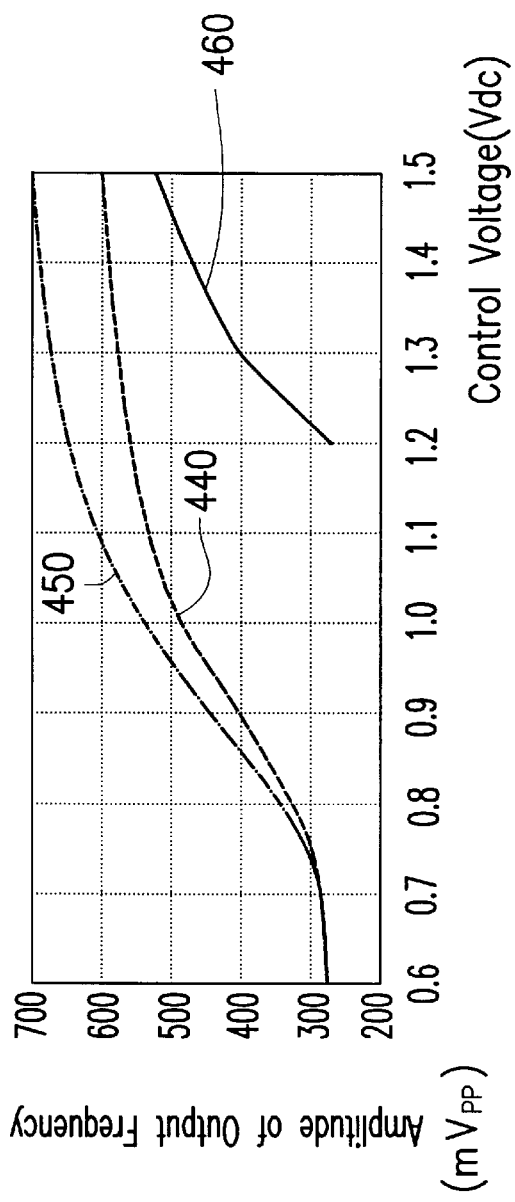
FIG. 9 is a graph showing the plots of the output-to-input characteristics (i.e., amplitude of the output frequency versus the magnitude of the control voltage) for the invention and the prior art.

$V_{ctl}$: control voltage
$f_g$: output frequency of the first preferred embodiment
$f_d$: output frequency of the second preferred embodiment
$f_c$: output frequency of the prior art
$V_{og}$: amplitude of the output frequency of the first preferred embodiment
$V_{od}$: amplitude of the output frequency of the second preferred embodiment
$V_{oc}$: amplitude of the output frequency of the prior art
$I_g$: output current of the first preferred embodiment
$I_d$: output current of the second preferred embodiment
$I_c$: output current of the prior art The data shown in Table 2 are further plotted into the graphs of FIGS. 8–9. FIG. 8 is a graph showing the plots of the output frequency versus control voltage characteristics for the three different kinds of ring oscillators, in which the curve 410 is plotted for the first preferred embodiment; the curve 420 is plotted for the second preferred embodiment; and the curve 430 is plotted for the prior art. Moreover, FIG. 9 is a graph showing the plots of the amplitude of the output frequency versus control voltage characteristics for the same three different kinds of ring oscillators, in which the curve 440 is plotted for the first preferred embodiment; the curve 450 is plotted for the second preferred embodiment; and the curve 460 is plotted for the prior art.

It can be learned from FIGS. 8–9 as well as from Table 2 that when the control voltage $V_{ctl}$ is reduced to below 1.2 V, no output frequency is generated from the prior art, whereas the first and second preferred embodiments of the invention are still able to allow near-linear output-to-input characteristics when the control voltage $V_{ctl}$ is reduced to below 1.2 V. Moreover, when the control voltage is above 1.2 V, both the first and second embodiments of the invention allow a higher gain (evident form the higher amplitudes) than the prior art.

Figure 7B:
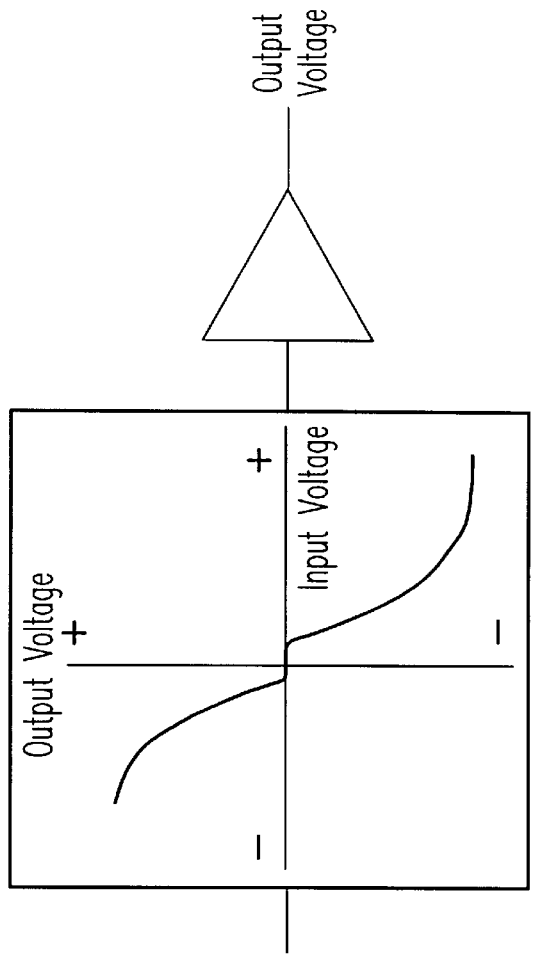
FIGS. 7A–7B are schematic diagrams used to depict the regeneration logic scheme used for the design of the ring oscillator of the invention.
Figure 7A:
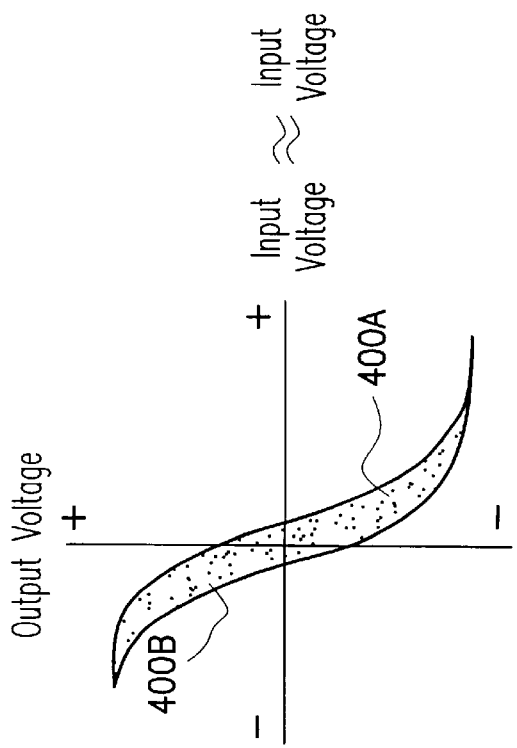

Furthermore, the principle of the regeneration logic scheme for the design of the ring oscillator of the invention is explained in the following with reference to FIGS. 7A–7B. In operation of the ring oscillator of the invention, the relationship of the amplitude of the output frequency to the input control voltage will be subjected to a hysteresis effect whose characteristics curve 400A is shown in FIG. 7A. The area enclosed by the hysteresis curve 400A, as indicated by the reference numeral 400B, is referred to as a hysteresis area. The hysteresis area 400B is equivalent to the clipping of the input control voltage by a clipping circuit, as illustrated in FIG. 7B. The hysteresis area 400B will result in a delay to the transmission of the input control voltage to the differential amplifier of the CMOS CSL inverter. This delay will the substantially affect the output frequency. Therefore, the output frequency can be adjusted by varying the size of the hysteresis area 400B. This scheme has the drawback of attenuating the input control voltage. However, if the input control voltage is greater than the hysteresis area 400B, the gain can be increased due to the regeneration effect. The improvement on the gain factor is evident from FIG. 9 (or Table 2), in that both the first and second preferred embodiments of the invention are seen to have greater amplitude than the prior art. Therefore, the invention is more advantageous in output-to-input characteristics than the prior art, particularly in the low-frequency regions.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded to the broadest interpretation so as to encompass all such modifications and similar arrangements.

What is claimed is:

1. A ring oscillator of the type including a plurality of cascaded stages of delay circuits for generating an oscillating signal in response to a control voltage, wherein each of the delay circuits comprises:
    a CMOS CSL inverter having a positive input port, a negative input port, a positive output port, and a negative output port, which also serves as the input/output ports of the delay circuits; and
    a positive-feedback gate structure for providing a positive feedback to the CMOS CSL inverter, the positive-feedback gate structure including:
        a first CMOS transistor whose drain is connected to the negative input port of the CMOS CSL inverter and whose gate is connected to the positive output port of the CMOS CSL inverter;
        a second CMOS transistor whose drain is connected to the positive input port of the CMOS CSL inverter and whose gate is connected to the negative output port of the CMOS CSL inverter; and
        a third CMOS transistor whose drain is connected to both the source of the first CMOS transistor and the source of the second CMOS transistor, whose source is connected to the ground, and whose drain is connected to the control voltage.

2. The ring oscillator of claim 1, wherein the plurality of cascaded stages of delay circuits is connected in such a manner that,
    on the first stage,
        the positive input port thereof is connected to the positive output port of the last stage, the negative input port thereof is connected to the negative output port of the last stage, the positive output port thereof is connected to the negative input port of the next stage, and the negative output port thereof is connected to the positive input port of the next stage;
    on each of those stages other than the first and last stages,
        the positive input port thereof is connected to the negative output port of the previous stage, the negative input port thereof if connected to the positive output port of the previous stage, the positive output port thereof is connected to the negative input port of the next stage, and the negative output port thereof is connected to the positive input port of the next stage; and
    on the last stage,
        the positive input port thereof is connected to the negative output port of the previous stage, the negative input port thereof is connected to the positive output port of the previous stage, the positive output port is connected to the positive input port of the first stage to form a positive feedback, and the negative output port thereof is connected to the negative input port of the first stage to form a negative feedback of the ring.

3. The ring oscillator of claim 2, further comprising a CSL buffer whose input is coupled to the output of one stage of the delay circuit to serve as a load.

4. A ring oscillator of the type including an even number of cascaded stages of delay circuits for generating an oscillating signal in response to a control voltage, wherein each of the delay circuits comprises:
    a CMOS CSL inverter having a positive input port, a negative input port, a positive output port, and a negative output port, which also serve as the input/output ports of the delay circuit; and
    a positive-feedback drain structure for providing a positive feedback to the CMOS CSL inverter, the positive-feedback drain structure including a first CMOS transistor, a second CMOS transistor, and a third CMOS transistor, wherein
        the drain of the first CMOS transistor is connected to both the positive output port of the CMOS CSL inverter and the gate of the second CMOS transistor, the source of the first CMOS transistor is connected to the drain of the thrird CMOS transistor, and the gate of the first CMOS transistor is connected to the negative output port of the CMOS CSL inverter;
        the drain of the second CMOS transistor is connected to both the negative output port of the CMOS CSL inverter and the gate of the first CMOS transistor, the source of the second CMOS transistor is connected to the drain of the third CMOS transistor, and the gate of the second CMOS transistor is connected to the positive output port of the CMOS CSL inverter; and
        the drain of the third CMOS transistor is connected to both the source of the first CMOS transistor and the source of the second CMOS transistor, the source of the third CMOS transistor is connected to the ground, and the gate of the third CMOS transistor is connected to the control voltage.

5. The ring oscillator of claim 4, wherein the even number of cascaded stages of delay circuits are connected in such a manner that,
    on the first stage,
        The positive input port thereof is connected to the positive output port of the last stage, the negative input port thereof is connected to the negative output port of the last stage, the positive output port thereof is connected to the negative input port of the next stage, and the negative output port thereof if connected to the positive input port of the next stage;
    on each of those stages other than the first and last stages, the positive input port thereof is connected to the negative output port of the previous stage, the negative input port thereof is connected to the positive output port of the previous stage, the positive output port thereof is connected to the negative input port of the next stage, and the negative output port thereof is connected to the positive input port of the next stage; and on the last stage, the positive input port thereof is connected to the negative output port of the previous stage, the negative input port thereof is connected to the positive output port of the previous stage, the positive output is connected to the positive input port of the first stage to form a positive feedback, and the negative output port thereof is connected to the negative input port of the first stage to form a negative feedback of the ring.

6. The ring oscillator of claim 5, further comprising a CSL buffer whose input is coupled to the output of one stage of the delay circuit to serve as a load and output driver.

7. A ring oscillator of the type including an odd number of cascaded stages of delay circuits for generating an oscillating signal in response to a control voltage, wherein each of the delay circuits comprises:

a CMOS CSL inverter having a positive input port, a negative input port, a positive output port, and a negative output port, which also serve as the input/output ports of the delay circuit; and a positive-feedback drain structure for providing a positive feedback to the CMOS CSL inverter, the positive-feedback drain structure including a first CMOS transistor, a second CMOS transistor, and a third CMOS transistor, wherein the drain of the first CMOS transistor is connected to both the positive output port of the CMOS CSL inverter and the gate of the second CMOS transistor, the source of the first CMOS transistor is connected to the drain of the third CMOS transistor, and the gate of the first CMOS transistor is connected to the negative output port of the CMOS CSL inverter;

the drain of the second CMOS transistor is connected to both the negative output port of the CMOS CSL inverter and the gate of the first CMOS transistor, the source of the second CMOS transistor is connected to the drain of the third CMOS transistor, and the gate of the second CMOS transistor is connected to the positive output port of the CMOS CSL inverter; and the drain of the third CMOS transistor is connected to both the source of the first CMOS transistor and the source of the second CMOS transistor, the source of the third CMOS transistor is connected to the ground, and the gate of the third CMOS transistor is connected to the control voltage.

8. The ring oscillator of claim 7, wherein the odd number of cascaded stages of delay circuits are connected in such a manner that, on each stage, the positive input port thereof is connected to the negative output port of the previous stage, the negative input port thereof is connected to the positive output port of the previous stage, the positive output port thereof is connected to the negative input port of the next stage, and the negative output port thereof is connected to the positive input port of the next stage; which in combination form a negative feedback of the ring capable of inducing an oscillation in delay mode and phase-shift mode.

9. The ring oscillator of claim 7, further comprising a CSL buffer whose input is coupled to the output of one stage of the delay circuit to serve as a load and output driver.

* * * * *